US006461778B1

(12) United States Patent
Holscher

(10) Patent No.: US 6,461,778 B1
(45) Date of Patent: Oct. 8, 2002

(54) IN-LINE METHOD OF MEASURING EFFECTIVE THREE-LEAF ABERRATION COEFFICIENT OF LITHOGRAPHY PROJECTION SYSTEMS

(75) Inventor: Richard D. Holscher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 09/734,307

(22) Filed: Dec. 11, 2000

(51) Int. Cl.$^7$ ................................................. G03F 9/00
(52) U.S. Cl. ........................................................ 430/30
(58) Field of Search ............................................. 430/30

(56) References Cited

U.S. PATENT DOCUMENTS

| | | | |
|---|---|---|---|
| 4,077,721 A | 3/1978 | Mohon | 356/124 |
| 5,187,539 A | 2/1993 | Adachi et al. | 356/124 |
| 5,898,501 A | 4/1999 | Suzuki et al. | 356/359 |
| 6,018,990 A | 2/2000 | Ueki | 73/104 |
| 6,075,650 A | 6/2000 | Morris et al. | 359/641 |

OTHER PUBLICATIONS

H. Fukuda, K. Hayano & S. Shirai, "Determination of higher–order lens aberrations using phase/amplitude linear algebra". Jun. 1999 International Conference on Electron, Ion, and Photo Beam Technology and Nanofabrication.

P. Dirksen, C. Juffermans, R. Pellens, M. Maenhoudt and P. De Bischop "Novel aberration monitor for optical lithography", Proc. SPIE 3679, p. 77, 1999.

J. P. Kirk, "Measurement of astigmatism in microlithography lenses", Proc. SPIE 3334, p. 848, 1998.

H. Nomura and T. Sato, "Techniques for measuring aberrations in lenses used in photolithography with printed patterns", Applied Optics, vol. 38, No. 13, p. 2800, May 1, 1999.

H. Nomura, K. Twarayama and T. Hohno "Higher order aberration measurement with printed patterns under extremely reduced illumination", Proc. SPIE 3679, p. 358, 1999.

C. Hsu, R. Chou and T. Hwang, "Characterizing lens distortion to overlay accuracy by using fine measurement pattern", Proc. SPIE 3677, p. 83, 1999.

J. P. Kirk and C. J. Progler, "Application of blazed gratings for determination of equivalent primary azimuthal aberrations", Proc. SPIE 3679, p. 70, 1999.

S. Nakao, A. Nakae, J. Sakai, T. Miura, S. Tatsu, K. Tsujita and W. Wakamia, "Measurment of spherical aberration utilizing an alternating phase shift mask", Jpn J. Appl. Phys., vol. 37, P 5949, 1998.

K. Rebitz and A. Smith, "Characterizing exposure tool optics in the fab", Microlithography World, p. 10, Summer 1999.

T.A. Brunner, "Impact of lens aberrations on optical lithography", IBM J. Res. Develop, vol. 41, No. ½, Jan./Mar. 1997.

*Primary Examiner*—Christopher G. Young
(74) *Attorney, Agent, or Firm*—Knobbe, Martens, Olson & Bear, LLP

(57) ABSTRACT

A method is provided for determining a value of an effective three-leaf aberration coefficient of an actual photolithography system. The method includes measuring at least two dimensions of a photolithography pattern produced by the actual photolithography system, and calculating an asymmetry from the two measured dimensions. The method further includes calculating the value of the effective three-leaf aberration coefficient corresponding to the calculated asymmetry. The method further includes determining the value of the effective three-leaf aberration coefficient corresponding to the actual asymmetry at the location by applying the relationship between the set of hypothetical asymmetries and the set of effective three-leaf aberration coefficients to the actual asymmetry for the location. At least two dimensions can include a first space between a left feature and a center feature, and a second space between a right feature and the center feature, the left, center, and right features imaged by the actual photolithography system.

26 Claims, 5 Drawing Sheets

LIGHT SOURCE

PATTERNED MASK

OPTICAL SYSTEM

PHOTORESIST
SEMICONDUCTOR WAFER

IN-LINE METHOD OF MEASURING EFFECTIVE THREE-LEAF ABERRATION COEFFICIENT OF LITHOGRAPHY PROJECTION SYSTEMS

BACKGROUND OF THE INVENTION

1. Field of the Invention

The present invention relates to the measurement, characterization, and simulation of aberrations of lithography projection systems.

2. Description of the Related Art

During semiconductor wafer processing, optical projection lithography is typically used to print fine integrated circuit patterns onto semiconductor wafers. As illustrated in FIG. 1, optical projection lithography utilizes a light source, a patterned mask, an optical system including elements such as projection lenses, mirrors, etc., and a semiconductor wafer coated with a thin layer of photoresist. The projected mask pattern is reduced in size by the optical system, typically by a factor of approximately four, and imaged onto the photoresist. The mask pattern of light and shadow imaged onto the photoresist causes chemical reactions which alter the photoresist that, together with additional processing steps, creates an identical, yet reduced in size, pattern of features on the wafer. The patterned photoresist layer then serves as a template on the semiconductor wafer for subsequent processing steps.

As lithography technology has advanced, optical projection lithography has achieved further reductions of feature sizes and increases of feature densities across the semiconductor wafer surface. These advancements have included better resolution by reducing the wavelength of the light used for imaging, tighter process controls, and improvements of the optical systems, processing equipment, and masks.

Elements of lithography optical systems are invariably manufactured with some degree of errors or aberrations. As the limit of optical lithography is pushed and feature densities continue to increase, pattern placement errors due to the aberrations become increasingly more important. Left uncorrected, these aberrations create distortions of the mask pattern on the wafer, resulting in mispositioning or misshaping of the various features across the wafer. However, once the aberrations of a particular optical system are known, masks can be designed so that the resulting features on the wafer have the desired positions and shapes.

Interferometry has been used for many years to characterize the aberrations of optical lithography lenses. However, these interferometry measurements must be performed before the lens is mounted into the optical system. It is therefore more desirable to utilize another method to quantify the optical aberrations which can be performed "in-line" (i.e., using product wafers themselves as they emerge from the lithography process, rather than performing some specialized test method or using a specialized test piece).

One method to mathematically model aberrations utilizes Zernike polynomials, which are a complete orthogonal set of polynomials over the interior of the unit circle. The Zernike series representation is useful for providing explicit expressions for the well-known low-order aberrations such as coma, astigmatism, etc. Generally, the Zernike coefficients $Z_n$ of the higher-order polynomials are less significant in the description of aberrations than are the lower-order coefficients. However, as feature sizes continue to shrink, a few of the higher-order coefficients are becoming increasingly more important in semiconductor processing. These higher-order coefficients include $Z_7$ (third-order X coma), $Z_8$ (third-order Y coma), $Z_9$ (third-order spherical), $Z_{10}$ (third-order three-leaf), $Z_{14}$ (fifth-order X coma), and $Z_{15}$ (fifth-order Y coma). For example, H. Fukuda, et al., "Determination of High-Order Lens Aberration Using Phase/Amplitude Linear Algebra," 43rd Int'l Conf. on Electron, Ion, and Photo Beam Technology and Nanofabrication, June 1999 discloses the use of side-lobe intensity measurements taken near the pattern edge of attenuated phase-shifting masks to detect higher-order aberrations. It is such coma aberrations, which can be characterized using $Z_7$ and $Z_{14}$ coefficients, which have been assumed to give rise to misalignments between the center digit line contact and the left and right storage node contacts of an exemplary DRAM circuit design during photolithography processes at wavelengths of 248 nm and 193 nm.

SUMMARY OF THE INVENTION

In accordance with one aspect of the present invention, a method is provided for determining a value of an effective three-leaf aberration coefficient of an actual photolithography system. The method comprises measuring at least two dimensions of a photolithography pattern produced by the actual photolithography system, and calculating an asymmetry from the two measured dimensions. The method further comprises calculating the value of the effective three-leaf aberration coefficient corresponding to the calculated asymmetry.

In accordance with another aspect of the present invention, a method is provided for determining a value of an effective three-leaf aberration coefficient of an actual photolithography system. The method comprises measuring a first space between a left storage node contact and a center digit line contact of a dynamic random access memory array, and measuring a second space between a right storage node contact and the center digit line contact of the dynamic random access memory array. The method further comprises calculating an asymmetry between the first space and the second space, and calculating the value of the effective three-leaf aberration coefficient corresponding to the calculated asymmetry.

In accordance with another aspect of the present invention, a method is provided for determining a value of an effective three-leaf aberration coefficient of an actual photolithography system. The method comprises measuring a first space between a left feature and a center feature, the left and center features imaged by the actual photolithography system. The method further comprises measuring a second space between a right feature and the center feature, the right feature imaged by the actual photolithography system. The method further comprises calculating an asymmetry between the first space and the second space, and calculating the value of the effective three-leaf aberration coefficient corresponding to the calculated asymmetry.

DETAILED DESCRIPTION OF THE PREFERRED EMBODIMENT

Figure 1:
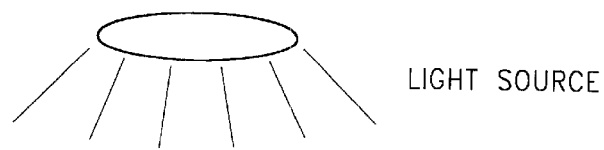
FIG. 1 schematically illustrates a photolithography system as known in the prior art.
Figure 1:
Figure 1:
Figure 1:
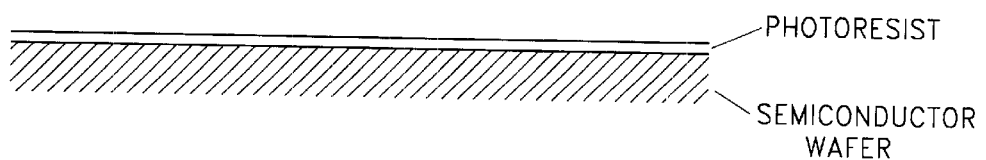
Figure 2:
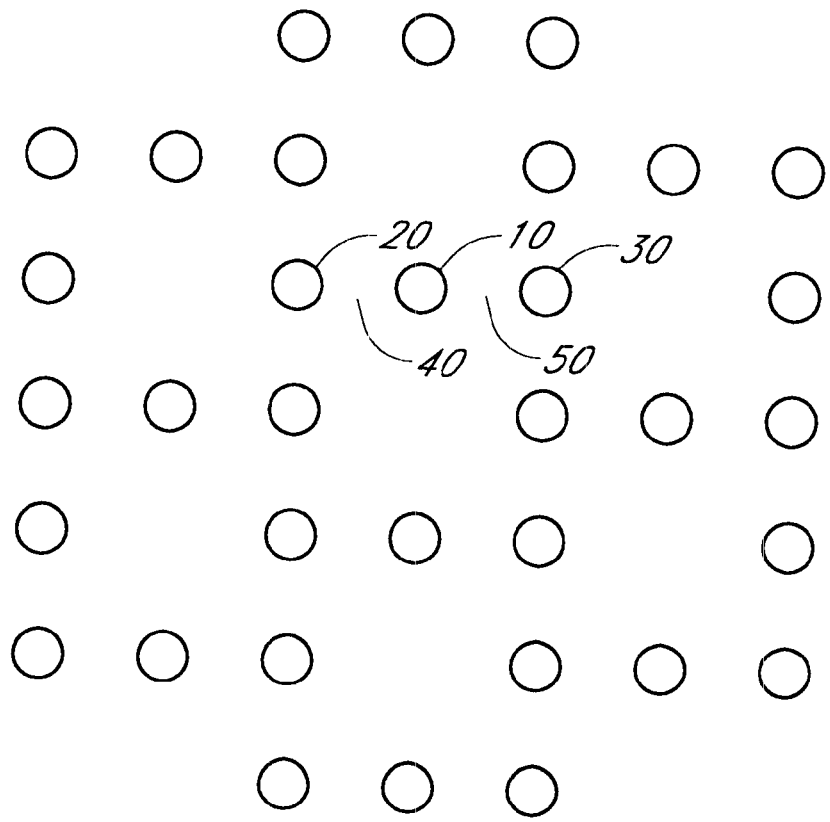
FIG. 2 schematically illustrates the configuration of center digit line contacts and left and right storage node contacts in a device array on a portion of a semiconductor wafer.

FIG. 2 schematically illustrates a configuration of photolithography features compatible with the present invention. The center digit line contacts 10, left storage node contacts 20, and right storage node contacts 30 schematically illustrated in FIG. 2 are components of a device array on a portion of a semiconductor wafer with a photolithography pattern produced using standard photolithography techniques known to persons skilled in the art. In particular, the pattern represents an array of contacts to the substrate in a state-of-the-art dynamic random access memory (DRAM) array.

The center digit line contacts 10, left storage node contacts 20, and right storage node contacts 30 provide connection to the source and drain of an underlying transistor. Preferably, the contacts have a width between about 0.15 $\mu$m and 0.30 $\mu$m, and more preferably between about 0.18 $\mu$m and 0.27 $\mu$m. In the illustrated embodiment, the contacts 10, 20, 30 are circular, with diameters preferably between about 0.15 $\mu$m and 0.30 $\mu$m, and more preferably between about 0.18 $\mu$m and 0.27 $\mu$m. Alternatively, the contacts 10, 20, 30 can have other shapes (e.g., rectangular strips). In addition, the center-to-center distance between the center digit line contact 10 and each of its storage node contacts 20, 30 is preferably between about 0.23 $\mu$m and 0.32 $\mu$m, and more preferably between about 0.25 $\mu$m and 0.30 $\mu$m. The spaces between these contacts have widths that are preferably between about 0.05 $\mu$m and 0.14 $\mu$m, and more preferably between about 0.07 $\mu$m and 0.12 $\mu$m. Photolithography features of these dimensions have been found particularly useful for experimentally determining Zernike coefficients in-line.

Misalignments between features of a photolithography pattern produced by an actual photolithography system can be characterized by measuring at least two dimensions of the photolithography pattern. For example, misalignments between the center digit line contacts 10 and the storage node contacts 20, 30 illustrated by FIG. 2 can be characterized by measuring the space 40 between the left storage node contact 20 and the center digit line contact 10 ("the left space") with the space 50 between the right storage node contact 30 and the center digit line contact 10 ("the right space"). The misalignment between photolithography features can be expressed in the form of an asymmetry, which is calculated from the two measured dimensions of the photolithography pattern. For the photolithography pattern illustrated in FIG. 2, a left-right asymmetry is defined as the width of the left space 40 minus the width of the right space 50. As described above, the left-right asymmetry has until recently been attributed to the contribution of a plurality of higher-order coma aberrations of the lithography optical systems, such as third-order X coma (characterized by the $Z_7$ Zernike coefficient) and fifth-order X coma (characterized by the $Z_{14}$ Zernike coefficient).

In order to better characterize the contributions of various aberrations to the misaliguments between features of the photolithography process, simulations were performed to calculate the misaliguments produced by particular optical system aberrations. These simulations were performed using the standard three-dimensional optical lithography simulation software package "Solid-C"™ which is sold by Sigma-CAD, Inc. of Campbell, Calif. "Solid-C"™ provides a simulation of the influence of residual wave aberrations of the projector optics of the lithography tool, and can describe these aberrations in terms of up to 37 Zernike polynomials. Persons skilled in the art can select and use an appropriate simulation software package to practice the present invention.

Figure 3:
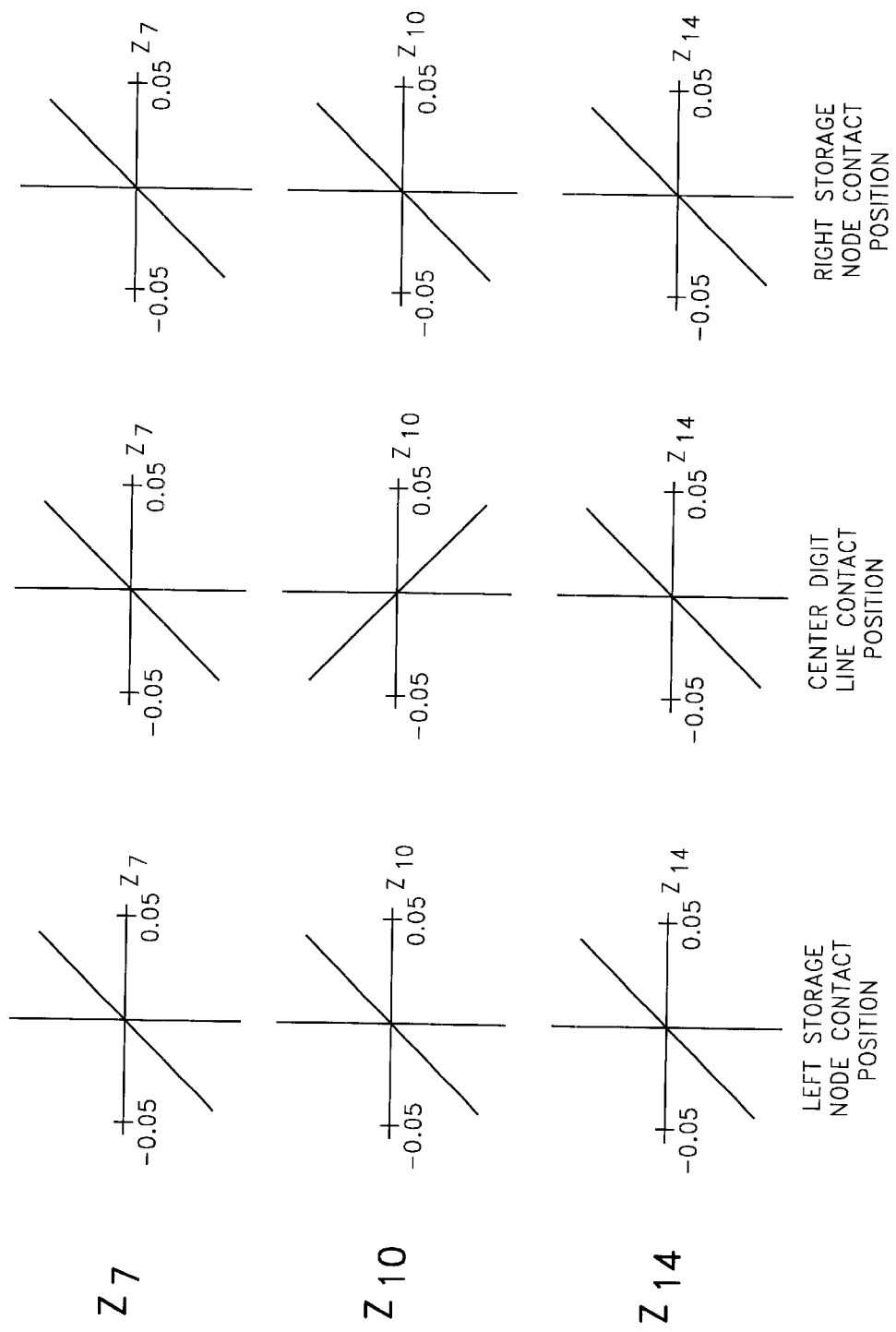
FIG. 3 schematically illustrates three sets of calculations designed to calculate the hypothetical positions of the left storage node contact, the center digit line contact, and the right storage node contact corresponding to various values of the Zernike coefficients $Z_7$, $Z_{10}$, and $Z_{14}$.

FIG. 3 illustrates three sets of calculations designed to calculate the hypothetical positions of the left storage node contact 20, the center digit line contact 10, and the right storage node contact 30 of the illustrated embodiment corresponding to various values of the Zernike coefficients $Z_7$, $Z_{10}$, and $Z_{14}$. In the preferred embodiment, $Z_{10}$ represents an effective three-leaf aberration coefficient in which the third-order contribution has been summed with the higher-order contributions, such as fifth-order, seventh-order, etc. The higher-order contributions are typically at most a few percent of the third-order contribution. Alternatively, in other embodiments, $Z_{10}$ represents the third-order, three-leaf aberration coefficient with no higher-order contributions added, and in still other embodiments, $Z_{10}$ is the third-order contribution summed with a subset of the higher-order contributions.

Each plot of FIG. 3 was calculated by zeroing all the Zernike coefficients except for one of $Z_7$, $Z_{10}$, and $Z_{14}$. The one non-zero Zernike coefficient was then varied to produce the individual plots. As illustrated in FIG. 3, the hypothetical positions of all three contacts 10, 20, 30 are linearly correlated with the values of $Z_7$ and $Z_{14}$. For example, for a value of $Z_7$ equal to 0.05, the hypothetical positions of all three contacts 10, 20, 30 are shifted to the right by approximately the same amount, and for a value of $Z_7$ equal to −0.05, the hypothetical positions of all three contacts 10, 20, 30 are shifted to the left by approximately the same amount. In addition, $Z_{14}$ produces linearly correlated shifts of the hypothetical positions of all three contacts 10, 20, 30 similar to those produced by $Z_7$. Therefore, the $Z_7$ and $Z_{14}$ coefficients do not appreciably contribute to the hypothetical left-right asymmetry since, as illustrated in FIG. 3, the hypothetical width of the left space 40 minus the hypothetical width of the right space 50 for these two aberrations is nearly zero.

However, as illustrated by FIG. 3, the contribution of $Z_{10}$ to the hypothetical positions of the illustrated contacts 10, 20, 30 differs from the contributions of $Z_7$ and $Z_{14}$. While the hypothetical positions of the left storage node contact 20 and right storage node contact 30 are linearly correlated with the value of $Z_{10}$, the hypothetical position of the center digit line contact 10 is anti-correlated with the value of $Z_{10}$. For example, for a value of $Z_{10}$ equal to 0.05, the hypothetical positions of the left and right storage node contacts 20, 30 are shifted to the right by approximately the same amount, but the hypothetical position of the center digit line contact 10 is shifted to the left. Similarly, a value of $Z_{10}$ equal to −0.05 results in a leftward shift of the hypothetical positions of the left and right storage node contacts 20, 30 and a rightward shift of the hypothetical position of the center digit line contact 10.

These simulations indicate that neither $Z_7$ nor $Z_{14}$ contributes appreciably to the hypothetical left-right asymmetry between the left space 40 and the right space 50, while $Z_{10}$ is a significant source of the hypothetical left-right asymmetry for the preferred contact mask design. Because the positions of all three contacts 10, 20, 30 are similarly affected by the optical higher-order coma aberrations corresponding to $Z_7$ and $Z_{14}$, the differences between the positions of these contacts are not sensitive to aberrations corresponding to $Z_7$ and $Z_{14}$. Conversely, the effective three-leaf aberration corresponding to $Z_{10}$ shifts the position of the center digit line contact 10 in the opposite direction from the shift of the left and right storage node contacts 20, 30. Therefore, $Z_{10}$ is a significant source of the left-right asymmetry between the width of the left space 40 and the width of the right space 50. This relationship between the left-right asymmetry and the $Z_7$, $Z_{14}$, and $Z_{10}$ aberration coefficients enables the determination of the effective three-leaf aberration coefficient of an actual photolithography system once the left-right asymmetry is calculated from measurements of the left space 40 and the right space 50.

Measurements of the left space 40 and the right space 50 at various positions within the exposure area of the optical system provide a sensitive measure of the values of $Z_{10}$ at these positions. In addition, the monitoring of the positions of masking products of the optical system (imaged features on a wafer), such as the center digit line contacts 10 and storage node contacts 20, 30, rather than measuring the lens and other elements of the optical system itself, provides a determination of the $Z_{10}$ aberration that can be performed "in-line."

Figure 4:
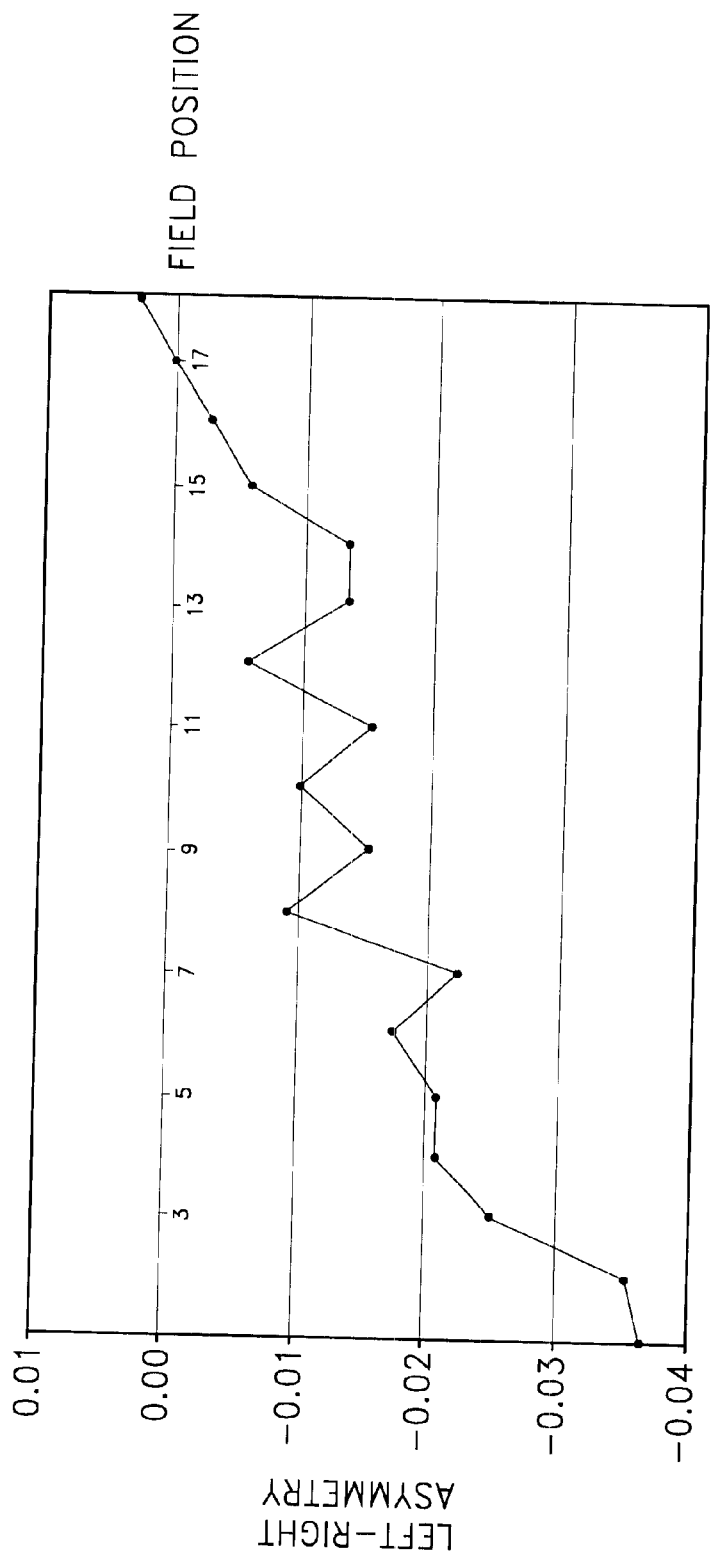
FIG. 4 illustrates the experimentally measured left-right asymmetry between the left space and the right space at various points across the 16 mm diameter of the exposure area.

FIG. 4 illustrates the calculated left-right asymmetry between the experimentally measured left space 40 and right space 50 at various points across the 16 mm diameter of the exposure area of an actual photolithography system under study. As can be seen from FIG. 4, the left-right asymmetry generally increases from the left side of the exposure area to the right side of the exposure area.

Figure 5:
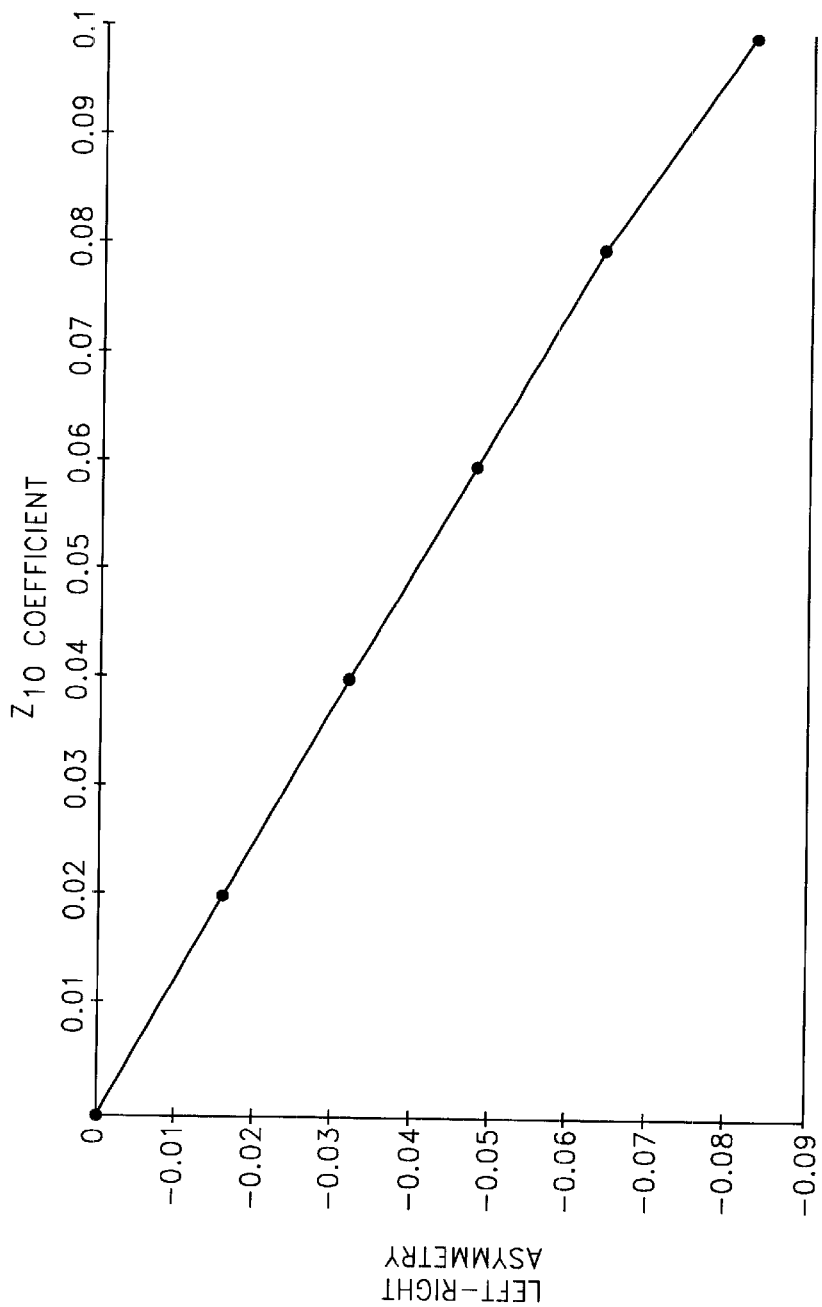
FIG. 5 illustrates the relationship between the hypothetical left-right asymmetry and the $Z_{10}$ coefficient.

FIG. 5 illustrates the relationship between the $Z_{10}$ aberration coefficients and the hypothetical left-right asymmetries generated by a hypothetical photolithography system modeled after an actual photolithography system under study. This relationship is determined by first calculating the hypothetical widths of the left space 40 and the right space 50 generated by the hypothetical photolithography system with various effective three-leaf aberration $Z_{10}$ coefficients. These hypothetical widths are then used to calculate a set of hypothetical left-right asymmetries corresponding the set of $Z_{10}$ coefficients, thereby determining a relationship between the set of hypothetical asymmetries and the set of $Z_{10}$ aberration coefficients for the hypothetical photolithography system.

This relationship is applied to the calculated asymmetry corresponding to the measured dimensions. Using this relationship, the calculated asymmetry at a given point in the exposure area of the imaged pattern produced by the actual photolithography system can be converted to a value of the effective three-leaf aberration coefficient $Z_{10}$. For example, applying the relationship between the $Z_{10}$ aberration coefficient and the hypothetical left-right asymmetries illustrated by FIG. 5, a calculated left-right asymmetry between the experimentally measured left space 40 and right space 50 of −0.037 nm corresponds to a value of $Z_{10}$ of 0.047. Alternatively, in other embodiments, the calculated left-right asymmetry may be normalized by dividing the difference between the width of the left space 40 and the width of the right space 50 by the sum of the widths of the left space 40 and right space 50. The asymmetry can be calculated at various other locations of the photolithography pattern to calculate the value of $Z_{10}$ at the various locations. Once the Zernike coefficients for the aberrations of the actual photolithography system are determined, the values of the Zernike coefficients can be used in the design of new mask patterns that account for the aberrations.

This invention may be embodied in other specific forms without departing from the essential characteristics as described herein. The embodiments described above are to be considered in all respects as illustrative only and not restrictive in any manner. The scope of the invention is indicated by the following claims rather than by the foregoing description. Ay and all changes which come within the meaning and range of equivalency of the claims are to be considered within their scope.

I claim:

1. A method of determining a value of an effective three-leaf aberration coefficient of an actual photolithography system, the method comprising:
    measuring at least two dimensions of a photolithography pattern produced by the actual photolithography system;
    calculating an asymmetry from the two measured dimensions; and
    calculating the value of the effective three-leaf aberration coefficient corresponding to the calculated asymmetry.

2. The method of claim 1, wherein calculating the value of the effective three-leaf aberration coefficient comprises:
    determining a relationship between a set of hypothetical asymmetries and a set of effective three-leaf aberration coefficients for a hypothetical photolithography system modeled upon the actual photolithography system; and
    applying the relationship to the calculated asymmetry between the two measured dimensions of the photolithography pattern produced by the actual photolithography system.

3. The method of claim 1, wherein the asymmetry is calculated at various locations of the photolithography pattern to calculate the value of the effective three-leaf aberration coefficient at various locations of the photolithography pattern.

4. The method of claim 1, wherein the effective three-leaf aberration coefficient represents a summation of a third-order contribution with higher-order contributions.

5. The method of claim 1, wherein the effective three-leaf aberration coefficient represents a third-order contribution with no higher-order contributions.

6. The method of claim 1, wherein the measured dimensions are features having widths between about 0.15 µm and 0.30 µm.

7. The method of claim 1, wherein the measured dimensions are features having widths between about 0.18 µm and 0.27 µm.

8. The method of claim 1, wherein the measured dimensions are spaces between features, the spaces having widths between about 0.05 µm and 0.14 µm.

9. The method of claim 1, wherein the measured dimensions are spaces between features, the spaces having widths between about 0.07 µm and 0.12 µm.

10. The method of claim 1, wherein the at least two dimensions comprise a space between a left storage node contact and a center digit line contact of a dynamic random access memory array, and a space between a right storage node contact and a center digit line contact of a dynamic random access memory array.

11. The method of claim 10, wherein the left storage node contact, center digit line contact, and right storage node contact are circular with diameters between about 0.15 µm and 0.30 µm.

12. The method of claim 10, wherein the left storage node contact, center digit line contact, and right storage node contact are circular with diameters between about 0.18 µm and 0.27 µm.

13. The method of claim 10, wherein the space between the left storage node contact and the center digit line contact and the space between the right storage node contact and the center digit line contact have widths between about 0.05 µm and 0.14 µm.

14. The method of claim 10, wherein the space between the left storage node contact and the center digit line contact and the space between the right storage node contact and the center digit line contact have widths between about 0.07 µm and 0.12 µm.

15. The method of claim 1, wherein calculating the asymmetry between the two measured dimensions comprises determining a difference between a first measured space between a left feature and a center feature and a second measured space between a right feature and the center feature.

16. The method of claim 15, wherein calculating the asymmetry between the two measured dimensions further comprises dividing the difference between the first measured space between the left feature and the center feature and the second measured space between the right feature and the center feature by the sum of the first and second measured spaces.

17. The method of claim 2, wherein determining the relationship between the set of hypothetical asymmetries and the set of effective three-leaf aberration coefficients for the hypothetical photolithography system comprises:

calculating a set of at least two dimensions corresponding to the set of effective three-leaf aberration coefficients of a hypothetical photolithography pattern hypothetically produced by the hypothetical photolithography system; and calculating the set of hypothetical asymmetries corresponding to the set of effective three-leaf aberration coefficients, the set of hypothetical asymmetries being based on the set of at least two hypothetical dimensions.

18. The method of claim 17, wherein the at least two hypothetical dimensions comprise a hypothetical space between a left storage node contact and a center digit line contact and a hypothetical space between a right storage node contact and the center digit line contact.

19. The method of claim 18, wherein calculating the set of hypothetical asymmetries comprises determining a difference between the hypothetical space between the left storage node contact and the center digit line contact and the hypothetical space between the right storage node contact and the center digit line contact.

20. The method of claim 19, wherein calculating the set of hypothetical asymmetries further comprises dividing the difference between the hypothetical space between the left storage node contact and the center digit line contact and the hypothetical space between the right storage node contact and the center digit line contact by the sum of the hypothetical space between the left storage node contact and the center digit line contact and the hypothetical space between the right storage node contact and the center digit line contact.

21. A method of determining a value of an effective three-leaf aberration coefficient of an actual photolithography system, the method comprising:

measuring a first space between a left storage node contact and a center digit line contact of a dynamic random access memory array;

measuring a second space between a right storage node contact and a center digit line contact of the dynamic random access memory array;

calculating an asymmetry between the first space and the second space; and calculating the value of the effective three-leaf aberration coefficient corresponding to the calculated asymmetry.

22. The method of claim 21, wherein the left storage node contact, center digit line contact, and right storage node contact are circular with diameters between about 0.15 µm and 0.30 µm.

23. The method of claim 21, wherein the left storage node contact, center digit line contact, and right storage node contact are circular with diameters between about 0.18 µm and 0.27 µm.

24. The method of claim 21, wherein the first space between the left storage node contact and the center digit line contact and the second space between the right storage node contact and the center digit line contact have widths between about 0.05 µm and 0.14 µm.

25. The method of claim 21, wherein the first space between the left storage node contact and the center digit line contact and the second space between the right storage node contact and the center digit line contact have widths between about 0.07 µm and 0.12 µm.

26. A method of determining a value of an effective three-leaf aberration coefficient of an actual photolithography system, the method comprising:

measuring a first space between a left feature and a center feature, the left and center features imaged by the actual photolithography system;

measuring a second space between a right feature and the center feature, the right feature imaged by the actual photolithography system;

calculating an asymmetry between the first space and the second space; and calculating the value of the effective three-leaf aberration coefficient corresponding to the calculated asymmetry.

* * * * *

UNITED STATES PATENT AND TRADEMARK OFFICE
CERTIFICATE OF CORRECTION

PATENT NO.    : 6,461,778 B1
DATED         : October 8, 2002
INVENTOR(S)   : Richard D. Holscher It is certified that error appears in the above-identified patent and that said Letters Patent is hereby corrected as shown below:

Column 2,
Line 15, please delete "misaliginnents", and insert -- misalignments --

Signed and Sealed this

Twenty-third Day of September, 2003

JAMES E. ROGAN
*Director of the United States Patent and Trademark Office*